(12) United States Patent
Ko et al.

(10) Patent No.: US 12,278,191 B2
(45) Date of Patent: Apr. 15, 2025

(54) SEMICONDUCTOR PACKAGES HAVING WIRING PATTERNS

(71) Applicant: SAMSUNG ELECTRONICS CO., LTD., Suwon-si (KR)

(72) Inventors: Youngchan Ko, Seoul (KR); Myungsam Kang, Hwaseong-si (KR); Jeongseok Kim, Cheonan-si (KR); Bongju Cho, Hwaseong-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 379 days.

(21) Appl. No.: 17/723,689

(22) Filed: Apr. 19, 2022

(65) Prior Publication Data

US 2023/0131240 A1 Apr. 27, 2023

(30) Foreign Application Priority Data

Oct. 26, 2021 (KR) .................. 10-2021-0143530

(51) Int. Cl.
*H01L 23/538* (2006.01)
*H01L 23/00* (2006.01)
(Continued)

(52) U.S. Cl.
CPC .... *H01L 23/5386* (2013.01); *H01L 23/49816* (2013.01); *H01L 23/49822* (2013.01); *H01L 23/49838* (2013.01); *H01L 23/5383* (2013.01); *H01L 25/105* (2013.01); *H01L 23/5389* (2013.01); *H01L 24/08* (2013.01); *H01L 24/16* (2013.01); *H01L 24/32* (2013.01); *H01L 24/48* (2013.01); *H01L 24/73* (2013.01); *H01L 2224/08235* (2013.01); *H01L 2224/16227* (2013.01); *H01L 2224/16237* (2013.01); *H01L 2224/32225* (2013.01); *H01L 2224/48228* (2013.01); *H01L 2224/73204* (2013.01); *H01L 2224/73265* (2013.01); *H01L 2225/1023* (2013.01); *H01L 2225/1041* (2013.01); *H01L 2225/1058* (2013.01); *H01L 2924/182* (2013.01)

(58) Field of Classification Search
CPC ............ H01L 24/18–20; H01L 23/5389
See application file for complete search history.

(56) References Cited

U.S. PATENT DOCUMENTS 8,138,014 B2 3/2012 Chi et al.
9,318,442 B1 4/2016 Chen
(Continued)

*Primary Examiner* — Evren Seven
*Assistant Examiner* — Cole Leon Lindsey
(74) *Attorney, Agent, or Firm* — Sughrue Mion, PLLC

(57) ABSTRACT

A semiconductor package includes a lower redistribution structure including a wiring layer, and a via connected to the wiring layer; a semiconductor chip on the lower redistribution structure; wiring patterns disposed on the lower redistribution structure and extending in a horizontal direction, the wiring patterns including a first wiring pattern; metal patterns on the wiring patterns, the metal patterns including a first connection pillar and a first dummy pillar disposed on the first wiring pattern; an encapsulant on the lower redistribution structure, the semiconductor chip, the wiring patterns, and the metal patterns; and an upper redistribution structure on the encapsulant. The first connection pillar is directly connected to the upper redistribution structure.

19 Claims, 23 Drawing Sheets

(51) Int. Cl.
 *H01L 23/498* (2006.01)
 *H01L 25/10* (2006.01)

(56) References Cited

U.S. PATENT DOCUMENTS

| | | |
|---|---|---|
| 10,256,114 B2 | 4/2019 | Huemoeller et al. |
| 10,325,891 B1 | 6/2019 | Lim et al. |
| 10,388,598 B2 | 8/2019 | Lu et al. |
| 10,916,488 B2 | 2/2021 | Lin et al. |
| 11,049,826 B2 | 6/2021 | Ogumi |
| 2016/0093572 A1* | 3/2016 | Chen .................. H01L 23/5389 |
| | | 438/126 |
| 2020/0006196 A1* | 1/2020 | Lin .................... H01L 23/5389 |
| 2020/0373216 A1 | 11/2020 | Yoo et al. |
| 2021/0090973 A1 | 3/2021 | Lee et al. |

\* cited by examiner

SEMICONDUCTOR PACKAGES HAVING WIRING PATTERNS

CROSS-REFERENCE TO THE RELATED APPLICATION

This application claims priority from Korean Patent Application No. 10-2021-0143530, filed on Oct. 26, 2021, in the Korean Intellectual Property Office, the disclosure of which is incorporated herein by reference in its entirety.

BACKGROUND

1. Field

Example embodiments of the disclosure relate to a semiconductor package having a wiring pattern.

2. Description of the Related Art

In accordance with a tendency of semiconductor devices toward miniaturization, miniaturization of each element in a semiconductor package is required. Accordingly, a package-on-package structure has been introduced.

SUMMARY

Example embodiments of the disclosure provide a semiconductor package having a wiring pattern disposed on a redistribution structure.

According to embodiments, a semiconductor package is provided. The semiconductor package includes: a lower redistribution structure including a wiring layer, and a via connected to the wiring layer; a semiconductor chip on the lower redistribution structure; wiring patterns on the lower redistribution structure, the wiring patterns including a first wiring pattern; metal patterns on the wiring patterns, the metal patterns including a first connection pillar and a first dummy pillar that are on the first wiring pattern; an encapsulant on the lower redistribution structure, the semiconductor chip, the wiring patterns, and the metal patterns; and an upper redistribution structure on the encapsulant, wherein the first connection pillar is directly connected to the upper redistribution structure.

According to embodiments, a semiconductor package is provided. The semiconductor package includes a lower package, and an upper package on the lower package. The lower package includes: a lower redistribution structure including a wiring layer, and a via connected to the wiring layer, a first semiconductor chip on the lower redistribution structure, wiring patterns on the lower redistribution structure, metal patterns on the wiring patterns, the metal patterns including connection pillars that are disposed on the wiring patterns, and further including dummy pillars that are on the wiring patterns; a first encapsulant covering the lower redistribution structure, the first semiconductor chip, the wiring patterns, and the metal patterns, and an upper redistribution structure on the first encapsulant. The upper package includes: a substrate; a second semiconductor chip on the substrate, at least one package connection terminal under the substrate and electrically connected to the upper redistribution structure, and a second encapsulant covering the substrate and the second semiconductor chip.

According to embodiments, a semiconductor package is provided. The semiconductor package includes: a lower redistribution structure including a wiring layer, and a via connected to the wiring layer; an outer connection terminal under the lower redistribution structure; a semiconductor chip on the lower redistribution structure; wiring patterns on the lower redistribution structure; metal patterns on the wiring patterns, the metal patterns including connection pillars and dummy pillars; an encapsulant covering the lower redistribution structure, the semiconductor chip, the wiring patterns, and the metal patterns; and an upper redistribution structure on the encapsulant, the upper redistribution structure including connection vias contacting the connection pillars, wherein the metal patterns form a lattice structure having a uniform spacing, and wherein at least one of the connection pillars and at least one of the dummy pillars are on each of the wiring patterns.

DETAILED DESCRIPTION

Figure 1:
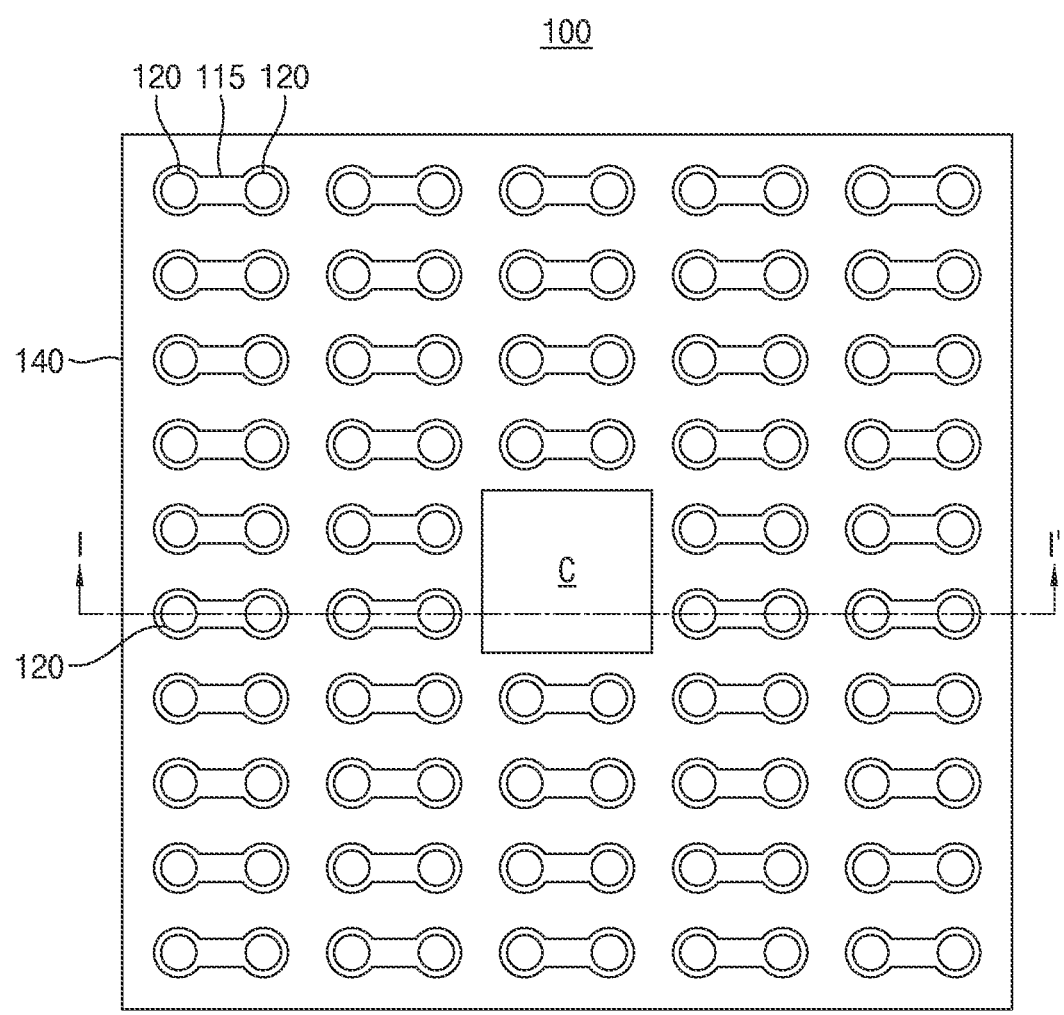
FIG. 1 is a plan view of a semiconductor package according to an example embodiment of the disclosure.
Figure 2:
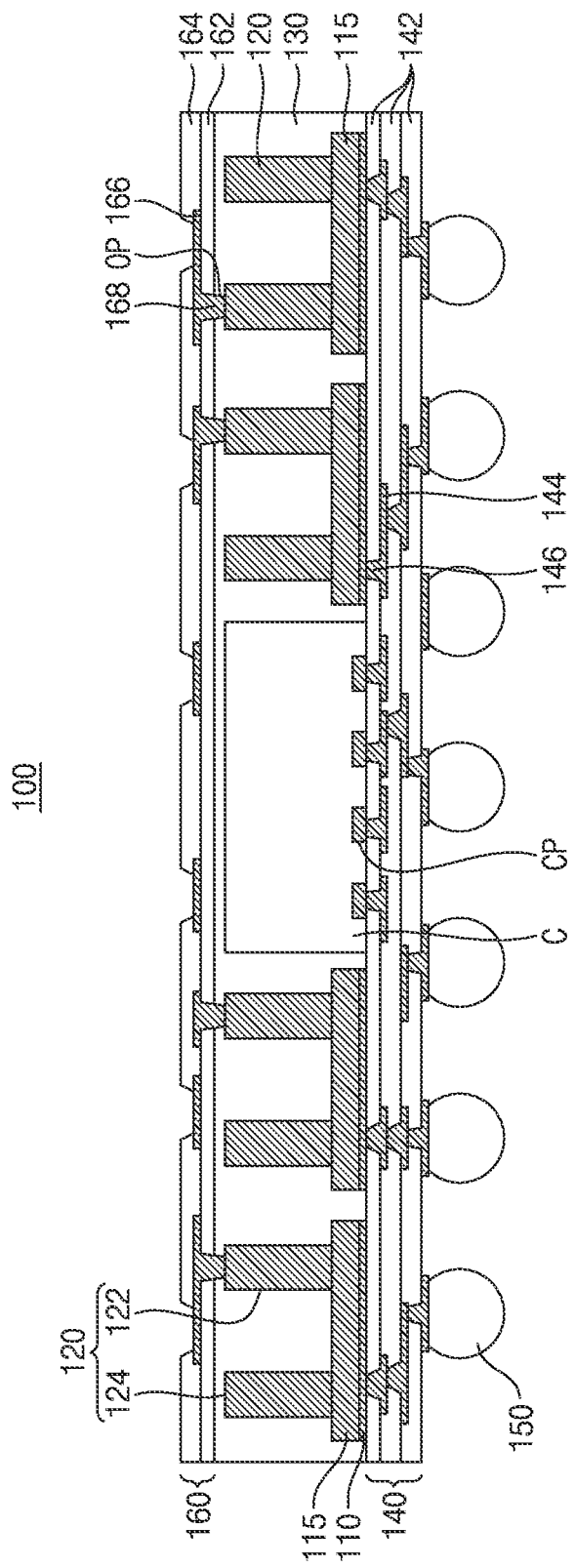
FIG. 2 is a vertical cross-sectional view taken along line I-I' of the semiconductor package shown in FIG. 1.

FIG. 1 is a plan view of a semiconductor package according to an example embodiment of the disclosure. FIG. 2 is a vertical cross-sectional view taken along line I-I' of the semiconductor package shown in FIG. 1.

Referring to FIGS. 1 and 2, a semiconductor package 100 may include a wiring pattern 115, a metal pattern 120, a semiconductor chip C, an encapsulant 130, a lower redistribution structure 140, an outer connection terminal 150, and an upper redistribution structure 160.

The wiring pattern 115 may be disposed on the lower redistribution structure 140, and may extend in a horizontal direction. A top surface of the wiring pattern 115 may be disposed at a lower level than a top surface of the semiconductor chip C. The semiconductor package 100 may further include a seed layer 110 between the wiring pattern 115 and the lower redistribution structure 140. In an embodiment, the seed layer 110 and the wiring pattern 115 may include copper (Cu).

The metal pattern 120 may be disposed on the wiring pattern 115, and may extend in a vertical direction. Although a top surface of the metal pattern 120 is shown as being disposed at the same level as the top surface of the semiconductor chip C, the example embodiments of the disclosure are not limited thereto. The metal pattern 120 may have a circular pillar shape. From among a plurality of the metal pattern 120, a metal pattern 120 connected to the upper redistribution structure 160 may be referred to as a connection pillar 122, and a metal pattern 120 not connected to the upper redistribution structure 160 may be referred to as a dummy pillar 124. The metal pattern 120 may include copper (Cu).

FIG. 1 is a plan view showing the wiring pattern 115 and the metal pattern 120 on the lower redistribution structure 140. Referring to FIG. 1, the metal pattern 120 may overlap with the wiring pattern 115 in the vertical direction. In an embodiment, the plurality of the wiring pattern 115 may be uniformly formed in a region other than a space in which the semiconductor chip C will be formed. For example, a plurality of the wiring pattern 115 may be disposed to form a lattice structure having a uniform spacing, and may have the same size. Although two of the metal pattern 120 are shown in FIG. 1 as being disposed on each wiring pattern 115, the example embodiments of the disclosure are not limited thereto. Although a plurality of the wiring pattern 115 is shown as being uniformly disposed on the lower redistribution structure 140, the example embodiments of the disclosure are not limited thereto.

Again referring to FIG. 2, the semiconductor chip C may be mounted on the lower redistribution structure 140, and may be spaced apart from the wiring pattern 115 and the metal pattern 120. The semiconductor chip C may include chip pads CP at a bottom surface thereof, and the chip pads CP may be electrically connected to the lower redistribution structure 140.

The encapsulant 130 may be disposed between the lower redistribution structure 140 and the upper redistribution structure 160. The encapsulant 130 may cover the lower redistribution structure 140, the wiring pattern 115, the metal pattern 120, and the semiconductor chip C. The metal pattern 120 and the semiconductor chip C may be completely covered by the encapsulant 130, and the top surfaces of the metal pattern 120 and the semiconductor chip C may not be exposed.

The lower redistribution structure 140 may include insulating layers 142, wiring layers 144, and vias 146. Insulating layers 142 may form a plurality of layers, and an uppermost one of the insulating layers 142 may contact the seed layer 110, the semiconductor chip C, and the encapsulant 130. Wiring layers 144 may extend among the insulating layers 142 in the horizontal direction, and vias 146 may extend in the vertical direction in order to interconnect the wiring layers 144, which are disposed at different layers. The chip pad CP and the wiring pattern 115 may be connected to the vias 146. The lower redistribution structure 140 may be electrically connected to the semiconductor chip C and the wiring pattern 115.

The outer connection terminal 150 may be disposed at a bottom surface of the lower redistribution structure 140. The outer connection terminal 150 may be connected to at least one of the wiring layers 144 of the lower redistribution structure 140. The outer connection terminal 150 may be electrically connected to the semiconductor chip C or the wiring pattern 115 via the lower redistribution structure 140.

The upper redistribution structure 160 may be disposed at a top surface of the encapsulant 130. The upper redistribution structure 160 may include an insulating layer 162, a protective layer 164, a wiring layer 166, and a connection via 168. The insulating layer 162 may cover the top surface of the encapsulant 130, the wiring layer 166 may extend on a top surface of the insulating layer 162 in the horizontal direction, and the connection via 168 may extend in the vertical direction in order to interconnect the wiring layer 166 and the metal pattern 120. For example, the connection via 168 may fill an opening OP formed at the top surface of the encapsulant 130, and may contact a top surface of the connection pillar 122. The wiring layer 166 may be electrically connected to the lower redistribution structure 140 via the connection pillar 122 and the wiring pattern 115.

As shown in FIG. 2, the wiring pattern 115 may interconnect at least one of the vias 146 and at least one of the connection pillars 122 and, as such, may function as a wiring. For example, the at least one of the vias 146 of the lower redistribution structure 140 connected to the wiring pattern 115 may not be aligned or overlapped with the connection pillar 122 and the connection via 168 in the vertical direction. For example, when viewed in a top view, the at least one of the vias 146 of the lower redistribution structure 140 connected to the wiring pattern 115 may be spaced apart from the connection pillar 122 and the connection via 168 in the horizontal direction.

As the wiring pattern 115 is disposed on the lower redistribution structure 140, freedom of design of the metal pattern may be secured and, as such, a semiconductor package 100 having a reduced size may be realized.

Figure 3:
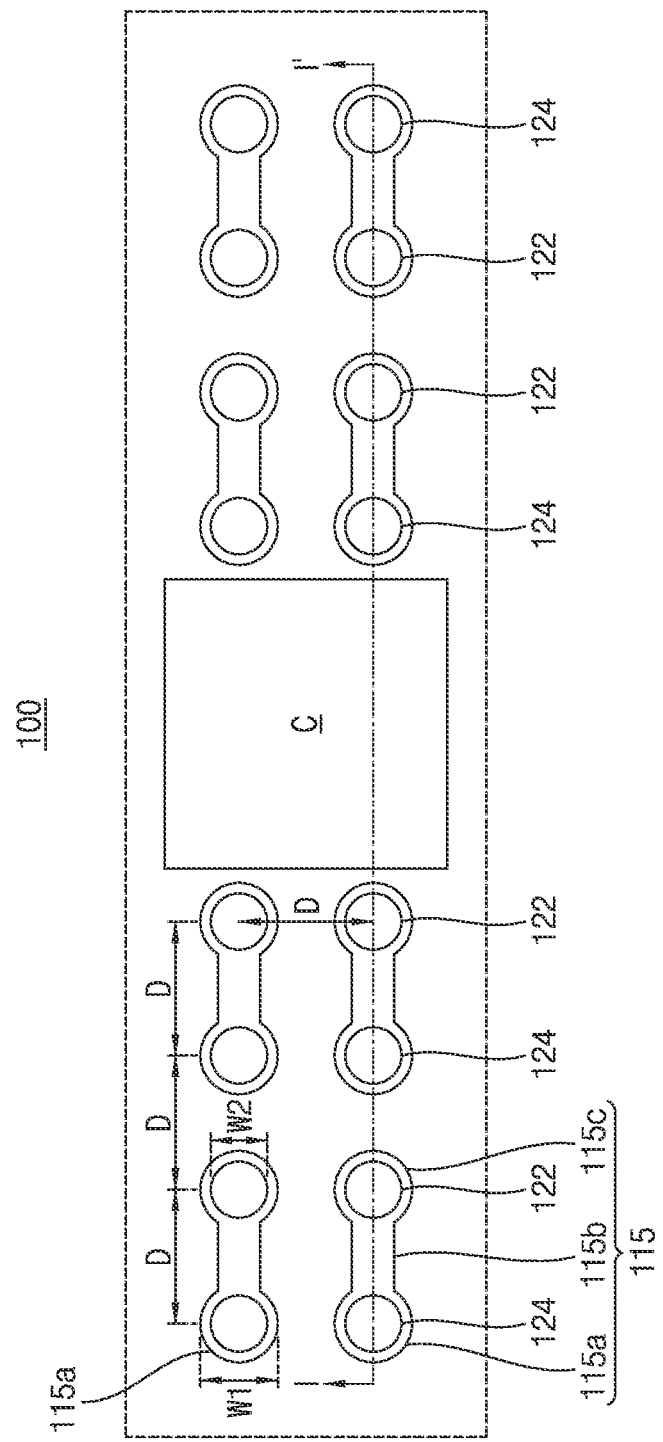
FIG. 3 is an enlarged view of the semiconductor package shown in FIG. 1.

FIG. 3 is an enlarged view of the semiconductor package shown in FIG. 1.

Referring to FIG. 3, each wiring pattern 115 may include at least one of a pad portion 115a and a line portion 115b. For example, two of the pad portion 115a may be disposed at opposite ends of one line portion 115b. The pad portion 115a may have a circular shape, without being limited thereto. In some embodiments, the pad portion 115a may have a shape such as an oval shape, a quadrangular shape, etc. The pad portion 115a may contact the connection pillar 122 or the dummy pillar 124. In a plan view, the connection pillar 122 and the dummy pillar 124 may overlap with respective ones of the pad portion 115a, and may be disposed inside the respective ones of the pad portion 115a. For example, a maximum width W1 of the pad portion 115a may be 130 to 230 µm, and a maximum width W2 of the metal pattern 120 may be 60 to 160 µm. The line portion 115b may be disposed between a plurality of the pad portion 115a, and may extend in the horizontal direction. The line portion 115b may have a shape such as a straight line shape, a bent line shape, a curved line shape, etc. The width of the line portion 115b may be smaller than the maximum width of the pad portion 115a.

The metal pattern 120 may be uniformly disposed, as described above, and the connection pillar 122 may have the same size as the dummy pillar 124. For example, two of the metal pattern 120 disposed on one wiring pattern 115 may be spaced apart from each other by a distance D. In addition, two adjacent ones of the metal pattern 120 disposed on two adjacent ones of the wiring pattern 115 may also be spaced apart from each other by the distance D. Here, the distance between the two of the metal pattern 120 may mean a horizontal distance between centers of the two of the metal pattern 120.

FIGS. 4 to 12 are vertical sectional views illustrating in process order of a method of manufacturing a semiconductor package according to an example embodiment of the disclosure.

Figure 4:
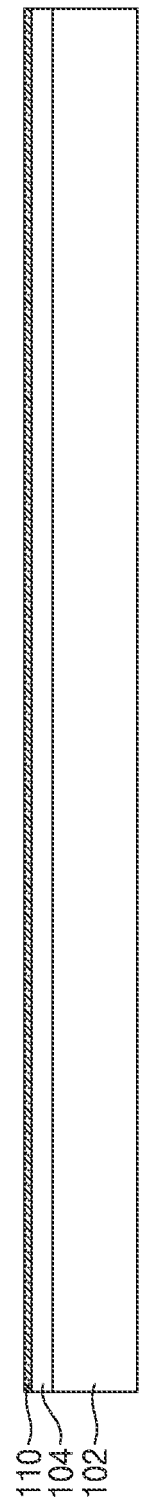
FIG. 4 is a vertical sectional view illustrating a method of manufacturing a semiconductor package according to an example embodiment of the disclosure.

Referring to FIG. 4, a carrier 102, an adhesive layer 104, and a seed layer 110 may be provided.

The carrier 102 may be a glass carrier, a ceramic carrier, a silicon wafer, or a conductive substrate including metal. The adhesive layer 104 may bond a structure, which will be formed thereon, to the carrier 102. In addition, the adhesive layer 104 may be removed from the upper structure, which will be described later, together with the carrier 102, and may include a polymer-based material. In an embodiment, the adhesive layer 104 may include a light-to-heat-conversion (LTHC) release coating material, and may be thermally released by heat. In another embodiment, the adhesive layer 104 may include an ultraviolet (UV) adhesive releasable by UV light. The adhesive layer 104 may be coated in a liquid state and then cured, or may be a laminate film laminated on the carrier 102. A top surface of the adhesive layer 104 may be flat, and may have high coplanarity.

The seed layer 110 may be formed on the adhesive layer 104. The seed layer 110 may be formed by physical vapor deposition (PVD), chemical vapor deposition (CVD), atomic layer deposition (ALD), or the like. The seed layer 110 may include copper (Cu), aluminum (Al), tungsten (W), nickel (Ni), titanium (Ti), titanium nitride (TiN), tantalum (Ta), tantalum nitride (TaN), gold (Au), or a combination thereof. In an embodiment, the seed layer 110 may include copper (Cu).

Figure 5:
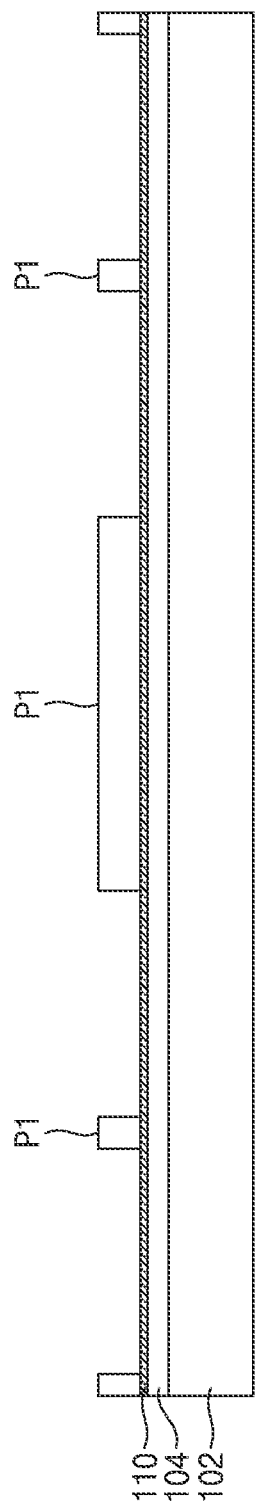
FIG. 5 is a vertical sectional view illustrating the method of manufacturing the semiconductor package according to the example embodiment of the disclosure.

Referring to FIG. 5, a photoresist P1 may be formed on the seed layer 110. The photoresist P1 formed on the seed layer 110 may be patterned by an exposure process, and may partially expose the seed layer 110.

Figure 6:
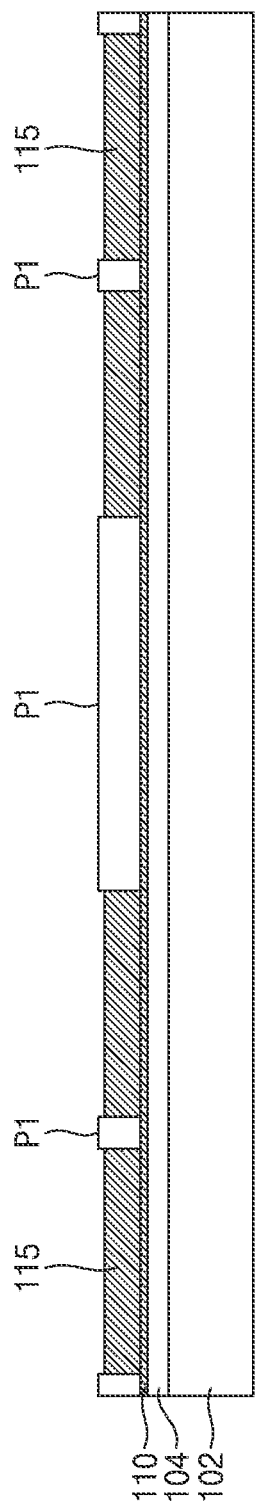
FIG. 6 is a vertical sectional view illustrating the method of manufacturing the semiconductor package according to the example embodiment of the disclosure.

Referring to FIG. 6, a plurality of the wiring pattern 115 may be formed on the seed layer 110. The plurality of the wiring pattern 115 may be formed to extend in a horizontal direction while being spaced apart from one another. The wiring pattern 115 may be formed by an electrochemical plating process, an electroless plating process, a PVD process, a CVD process, a spin-on process, or a combination thereof. In an embodiment, the wiring pattern 115 may be formed by a plating process using a portion of the seed layer 110 exposed by the photoresist P1 as a seed.

Figure 7:
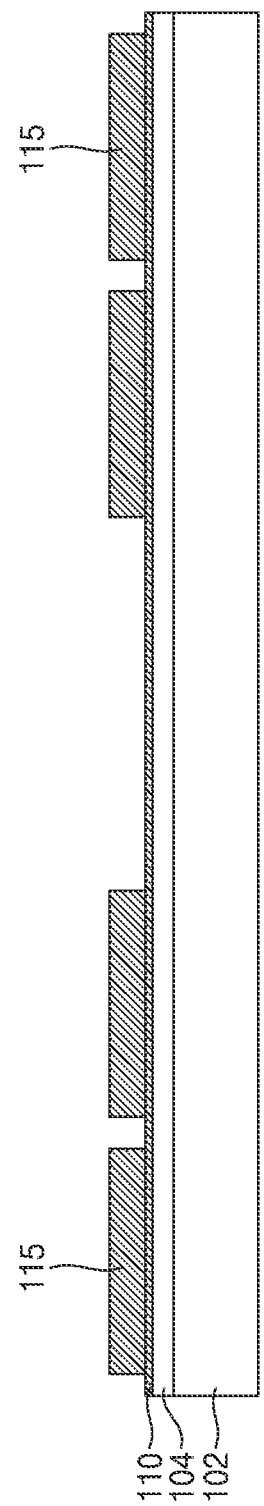
FIG. 7 is a vertical sectional view illustrating the method of manufacturing the semiconductor package according to the example embodiment of the disclosure.

Referring to FIG. 7, the photoresist P1 may be removed. The photoresist P1 may be removed by, for example, an ashing process and a stripping process. After removal of the photoresist P1, side surfaces of the plurality of the wiring pattern 115 and a top surface of the seed layer 110 may be exposed.

Figure 8:
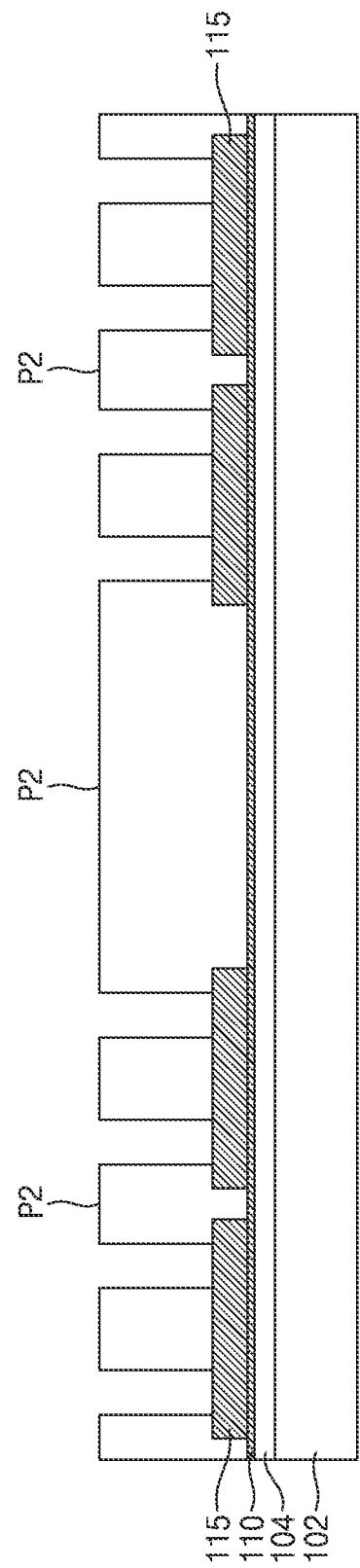
FIG. 8 is a vertical sectional view illustrating the method of manufacturing the semiconductor package according to the example embodiment of the disclosure.

Referring to FIG. 8, a photoresist P2 may be formed on the resultant structure of FIG. 7. The photoresist P2 formed on the seed layer 110 and the wiring pattern 115 may be patterned by an exposure process, and may partially expose the wiring pattern 115. The photoresist P2 may be formed to be higher than the photoresist P1.

Figure 9:
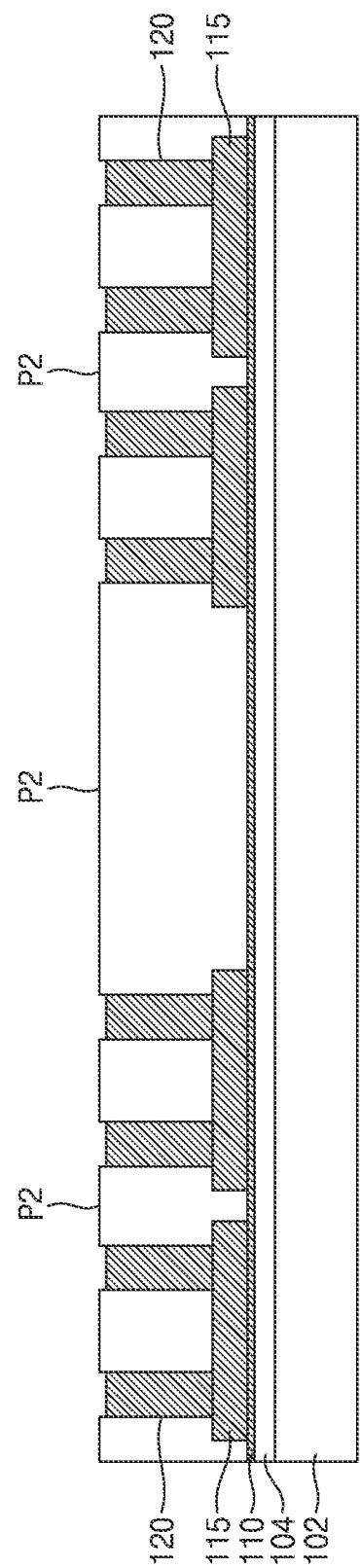
FIG. 9 is a vertical sectional view illustrating the method of manufacturing the semiconductor package according to the example embodiment of the disclosure.

Referring to FIG. 9, a plurality of the metal pattern 120 may be formed on the wiring pattern 115. The plurality of the metal pattern 120 may be formed to extend in a vertical direction while being spaced apart from one another. The metal pattern 120 may be formed by a plating process using a portion of the wiring pattern 115 exposed by the photoresist P2 as a seed. In an embodiment, two of the metal pattern 120 may be disposed on each wiring pattern 115, without being limited thereto. In an embodiment, no metal pattern 120 may be formed on at least one wiring pattern 115, or one metal pattern 120 or three or more of the metal pattern 120 may be formed on at least one wiring pattern 115. The plurality of the wiring pattern 115 may be uniformly formed in a region other than a space in which a semiconductor chip C will be formed. For example, the plurality of the wiring pattern 115 may be disposed to form a lattice structure while being spaced apart from one another by a uniform distance.

As the plurality of the metal pattern 120 is formed to have a uniform spacing, as shown in FIGS. 1 and 9, dispersion of the plurality of the metal pattern 120 may be reduced, and the plurality of the metal pattern 120 may be uniform in height.

Although the photoresist P2 is shown in FIGS. 7 and 8 as being formed on the wiring pattern 115 after removal of the photoresist P1, the example embodiments of the disclosure are not limited thereto. In an embodiment, the metal pattern 120 may be formed without removal of the photoresist P1. For example, the metal pattern 120 may be formed by further forming the photoresist P2 on the resultant structure of FIG. 6, patterning the photoresist P2, and then filling an inside of the photoresist P2 with a conductive material.

Figure 10:
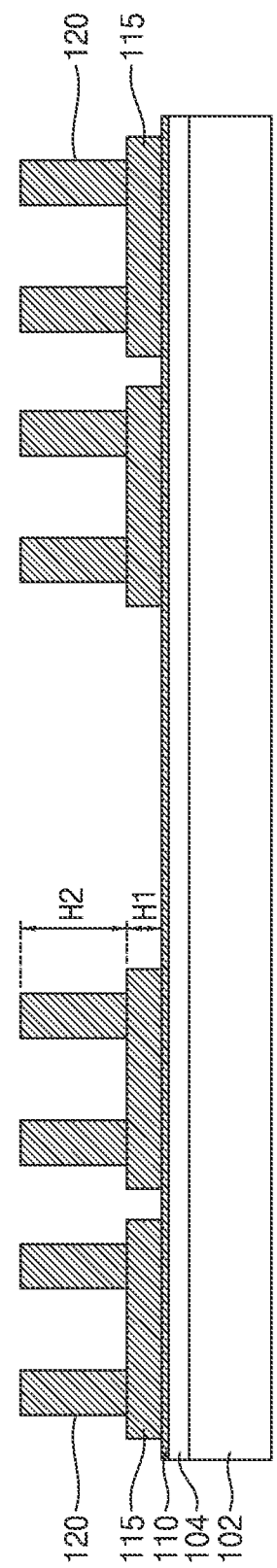
FIG. 10 is a vertical sectional view illustrating the method of manufacturing the semiconductor package according to the example embodiment of the disclosure.

Referring to FIG. 10, the photoresist P2 may be removed. The photoresist P2 may be removed by, for example, an ashing process and a stripping process. After removal of the photoresist P2, side surfaces of the plurality of the metal pattern 120, the top surface of the seed layer 110, and top surfaces of the plurality of the wiring pattern 115 may be exposed. In an embodiment, a height (a vertical length) H2 of the metal pattern 120 may be greater than a height (a vertical length) H1 of the wiring pattern 115. For example, the height H1 of the wiring pattern 115 may be 25 to 45 and the height H2 of the metal pattern 120 may be 65 to 100 µm.

Figure 11:
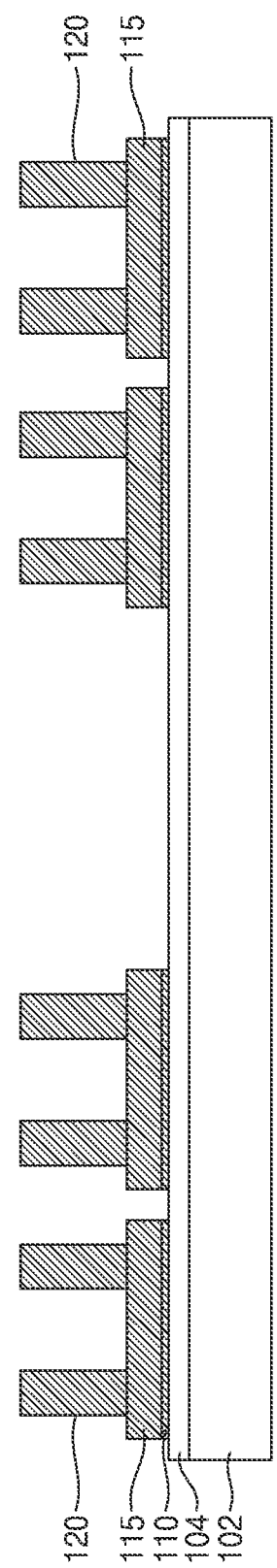
FIG. 11 is a vertical sectional view illustrating the method of manufacturing the semiconductor package according to the example embodiment of the disclosure.

Referring to FIG. 11, a portion of the seed layer 110 not covered by the wiring pattern 115 may be removed and, as such, the top surface of the adhesive layer 104 may be exposed. For example, the seed layer 110 may be etched by an etching process using the wiring pattern 115 as an etch mask. After the etching process, the seed layer 110 may be disposed between the wiring pattern 115 and the adhesive layer 104.

Figure 12:
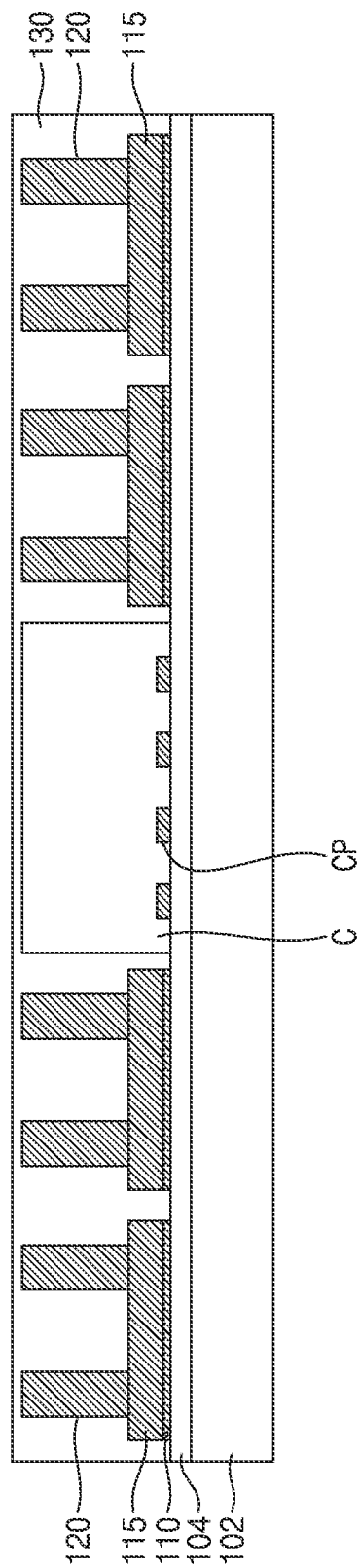
FIG. 12 is a vertical sectional view illustrating the method of manufacturing the semiconductor package according to the example embodiment of the disclosure.

Referring to FIG. 12, the semiconductor chip C may be mounted on the adhesive layer 104. The semiconductor chip C may include chip pads CP disposed at a bottom surface thereof. The semiconductor chip C may be disposed on the adhesive layer 104 such that the chip pads CP are directed toward the adhesive layer 104.

Thereafter, an encapsulant 130 covering the wiring pattern 115, the metal pattern 120, and the semiconductor chip C may be formed. The encapsulant 130 may completely cover top surfaces of the metal pattern 120 and the semiconductor chip C. The encapsulant 130 may be a resin including epoxy, polyimide or the like. For example, the encapsulant 130 may include a bisphenol-group epoxy resin, a polycyclic aromatic epoxy resin, an o-cresol novolac epoxy resin, a biphenyl-group epoxy resin, a naphthalene-group epoxy resin, or the like.

Again referring to FIG. 2, the carrier 102 and the adhesive layer 104 may be removed, and a lower redistribution structure 140, an outer connection terminal 150, and an upper redistribution structure 160 may be formed. The lower redistribution structure 140 may be formed on the wiring pattern 115 and the semiconductor chip C under the condition that a carrier 102 is formed on a top surface of the encapsulant 130 shown in FIG. 12, and the resultant structure of FIG. 12 is then inverted. The lower redistribution structure 140 may include insulating layers 142, wiring layers 144, and vias 146. Insulating layers 142 may form a plurality of layers, and an uppermost one of the insulating layers 142 may contact the seed layer 110, the semiconductor chip C, and the encapsulant 130. Wiring layers 144 may extend among the insulating layers 142 in the horizontal direction, and may form a plurality of layers. Vias 146 may extend in the vertical direction in order to interconnect the wiring layers 144, which are disposed at different layers. The vias 146 may also connect the seed layer 110 and one of the chip pads CP to corresponding ones of the wiring layers 144. The wiring layers 144 and the vias 146 may be formed by, for example, a dual damascene process. The wiring layers 144 and the vias 146 may be formed by forming one of the insulating layers 142, forming an opening at the one of the insulating layers 142, depositing a conductive material in the opening, and then patterning the conductive material. Through repetition of this process, the lower redistribution structure 140 may be formed.

The insulating layers 142 may include a polymer such as polybenzoxazole (PBO), polyimide, benzocyclobutene (BCB), etc. In another embodiment, the insulating layers 142 may include silicon nitride, silicon oxide, phosphosilicate glass (PSG), borosilicate glass (BSG), boron-doped phosphosilicate glass (BPSG), or a combination thereof. The insulating layers 142 may be formed by a process such as chemical vapor deposition, stacking, spin coating, etc. The wiring layers 144 and the vias 146 may include copper (Cu), aluminum (Al), tungsten (W), nickel (Ni), titanium (Ti), titanium nitride (TiN), tantalum (Ta), tantalum nitride (TaN), gold (Au), or a combination thereof.

The outer connection terminal 150 may be disposed at a bottom surface of the lower redistribution structure 140, may be electrically connected to at least one of the wiring layers 144 and at least one of the vias 146 corresponding thereto, and may also be electrically connected to the wiring pattern 115 corresponding thereto via the lower redistribution structure 140. The outer connection terminal 150 may include tin (Sn), silver (Ag), copper (cu), palladium (Pd), bismuth (Bi), or antimony (Sb).

The upper redistribution structure 160 may be formed at the top surface of the encapsulant 130. The upper redistribution structure 160 may include an insulating layer 162, a protective layer 164, a wiring layer 166, and a connection via 168. The insulating layer 162 may cover the top surface of the encapsulant 130, and may include a material identical or similar to that of the insulating layers 142. The wiring layer 166 and the connection via 168 may be formed by etching the insulating layer 162 and the encapsulant 130 such that a top surface of a part of the plurality of the metal pattern 120 is exposed, thereby forming an opening OP, and filling the opening OP with a conductive material. The wiring layer 166 may extend on a top surface of the insulating layer 162 in the horizontal direction, and the connection via 168 may extend in the vertical direction to interconnect the wiring layer 166 and the metal pattern 120. From among the plurality of the metal pattern 120, a metal pattern 120 contacting the connection via 168 may be referred to as a connection pillar 122, and a metal pattern 120 not contacting the connection via 168 may be referred to as a dummy pillar 124. The wiring layer 166 may be electrically connected to the lower redistribution structure 140 via the connection pillar 122 and the wiring pattern 115.

The wiring layer 166 and the connection via 168 may include the same materials as the wiring layers 144 and the vias 146, respectively. The protective layer 164 may be formed on the insulating layer 162, and may partially cover the wiring layer 166. The protective layer 164 may include the same material as the insulating layer 162.

Figure 13:
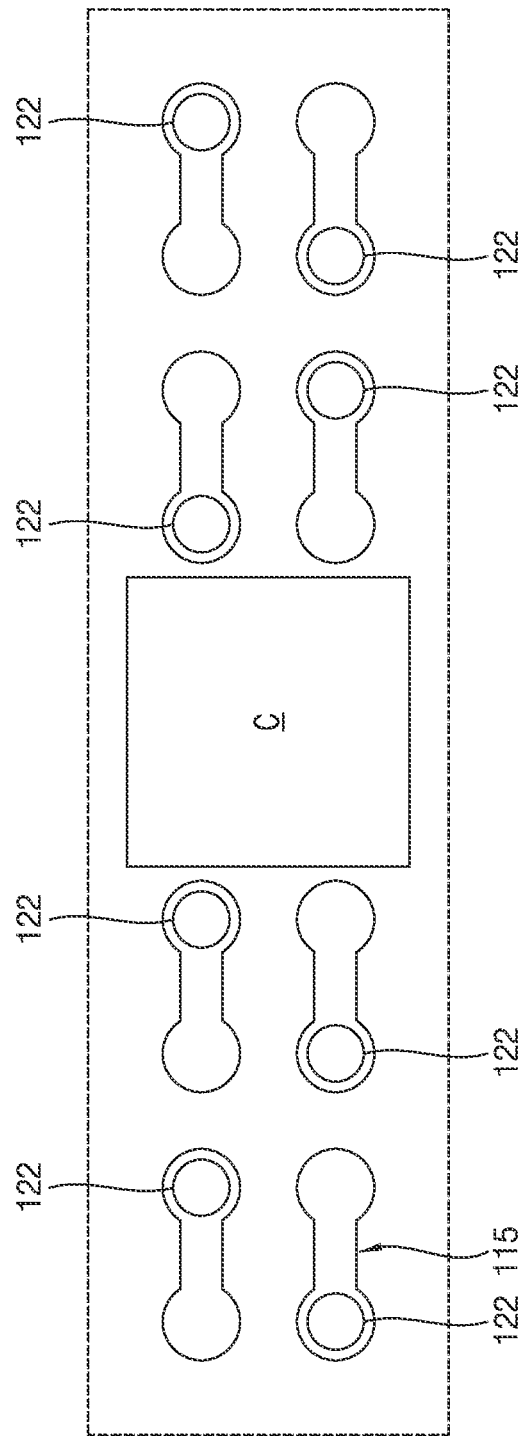
FIG. 13 is a plan view of a semiconductor package according to an example embodiment of the disclosure.

FIG. 13 is a plan view of a semiconductor package according to an example embodiment of the disclosure.

Referring to FIG. 13, only one metal pattern 120 may be disposed on at least one wiring pattern 115. For example, only one connection pillar 122 may be disposed on each wiring pattern 115, and a dummy pillar 124 may be omitted. Alternatively, only one dummy pillar 124 may be disposed on at least one wiring pattern 115.

Figure 14:
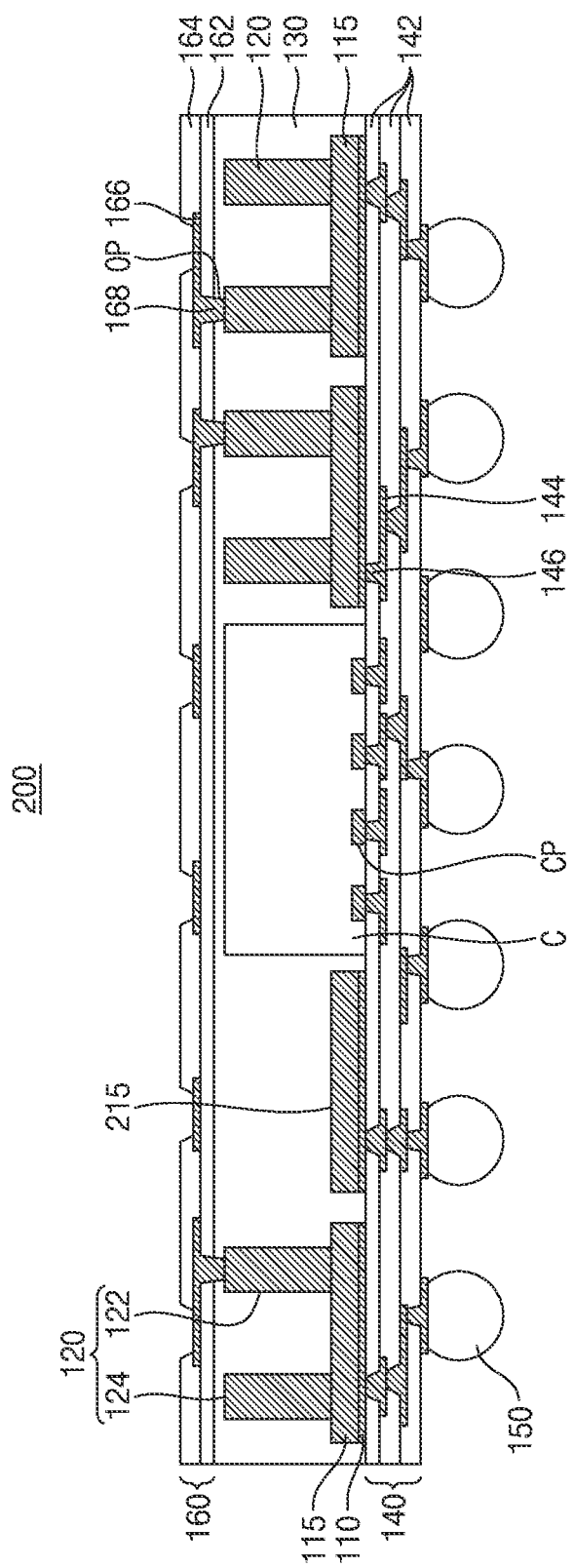
FIG. 14 is a vertical cross-sectional view of a semiconductor package according to an example embodiment of the disclosure.
Figure 15:
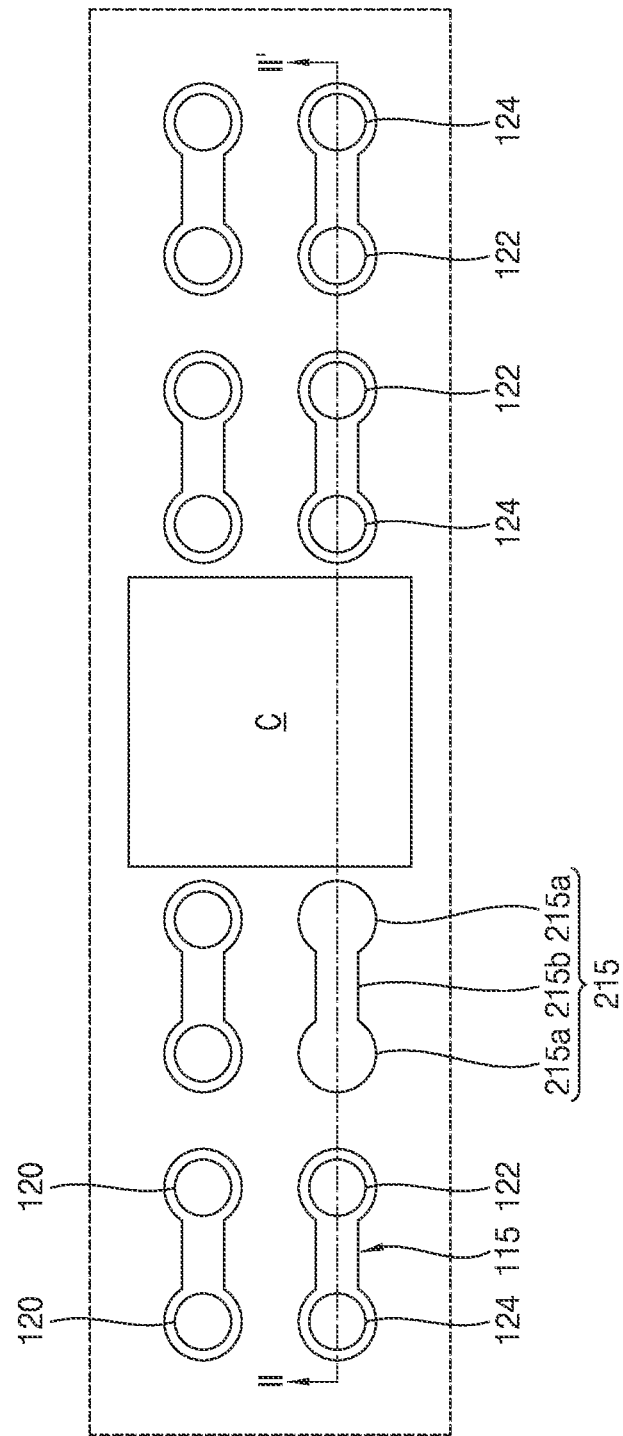
FIG. 15 is a plan view of the semiconductor package shown in FIG. 14.

FIG. 14 is a vertical cross-sectional view of a semiconductor package according to an example embodiment of the disclosure. FIG. 15 is a plan view of the semiconductor package shown in FIG. 14. FIG. 14 may correspond to a vertical cross-sectional view taken along line II-II' in FIG. 15.

Referring to FIGS. 14 and 15, a semiconductor package 200 may include a wiring pattern 215 disposed on a lower redistribution structure 140. In an embodiment, the wiring pattern 215 may be a dummy pattern. For example, no metal pattern 120 may be disposed on the wiring pattern 215, and the wiring pattern 215 may be spaced apart from the plurality of the metal pattern 120. Although the wiring pattern 215 is shown as being connected to one of the vias 146, the example embodiments of the disclosure are not limited thereto. In an embodiment, the wiring pattern 215 may have the same shape as a wiring pattern 115. For example, the wiring pattern 215 may include pad portions 215a, and a line portion 215b interconnecting the pad portions 215a. In an embodiment, the wiring pattern 215 may not include the pad portions 215a, and may have a shape such as a circular shape, an oval shape, a line shape, etc.

Figure 16:
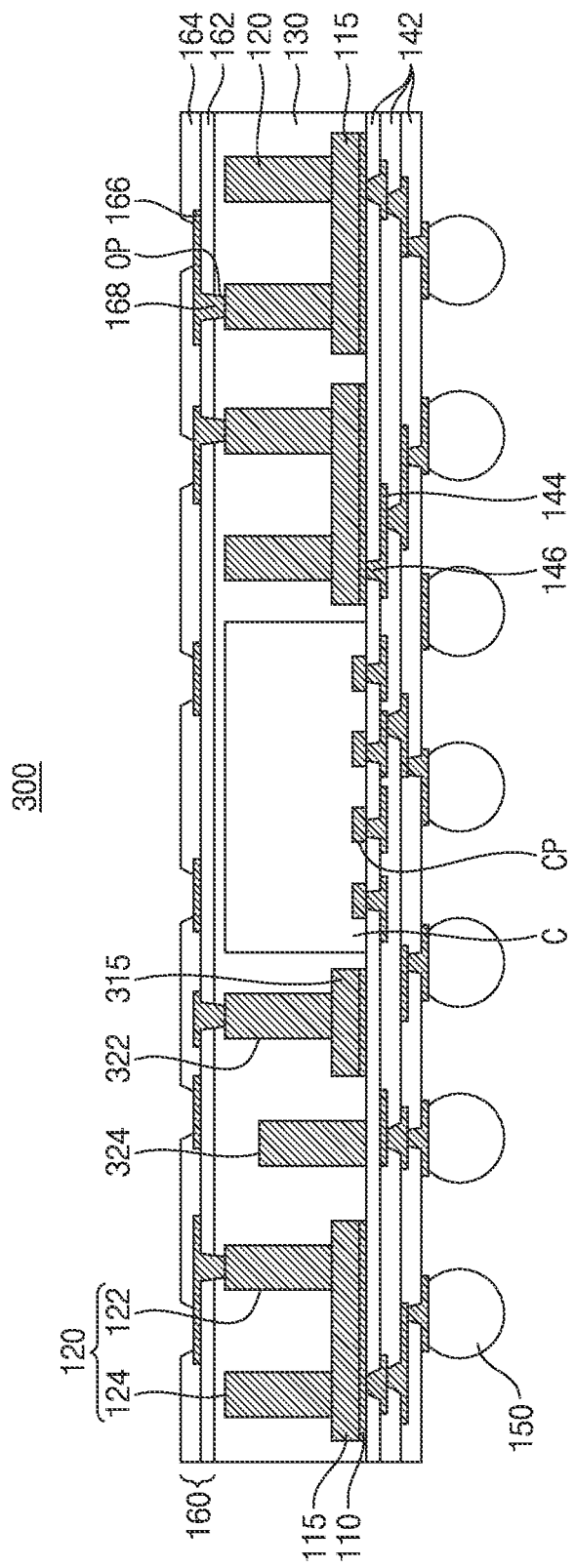
FIG. 16 is a vertical cross-sectional view of a semiconductor package according to an example embodiment of the disclosure.
Figure 17:
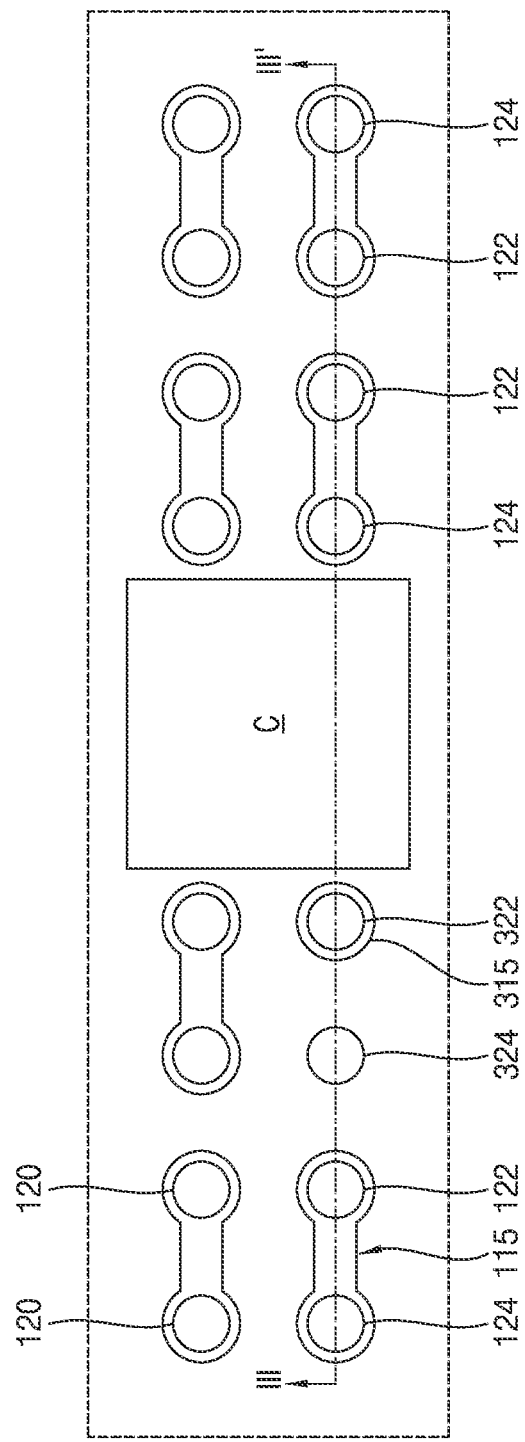
FIG. 17 is a plan view of semiconductor packages according to an example embodiment of the disclosure.
Figure 18:
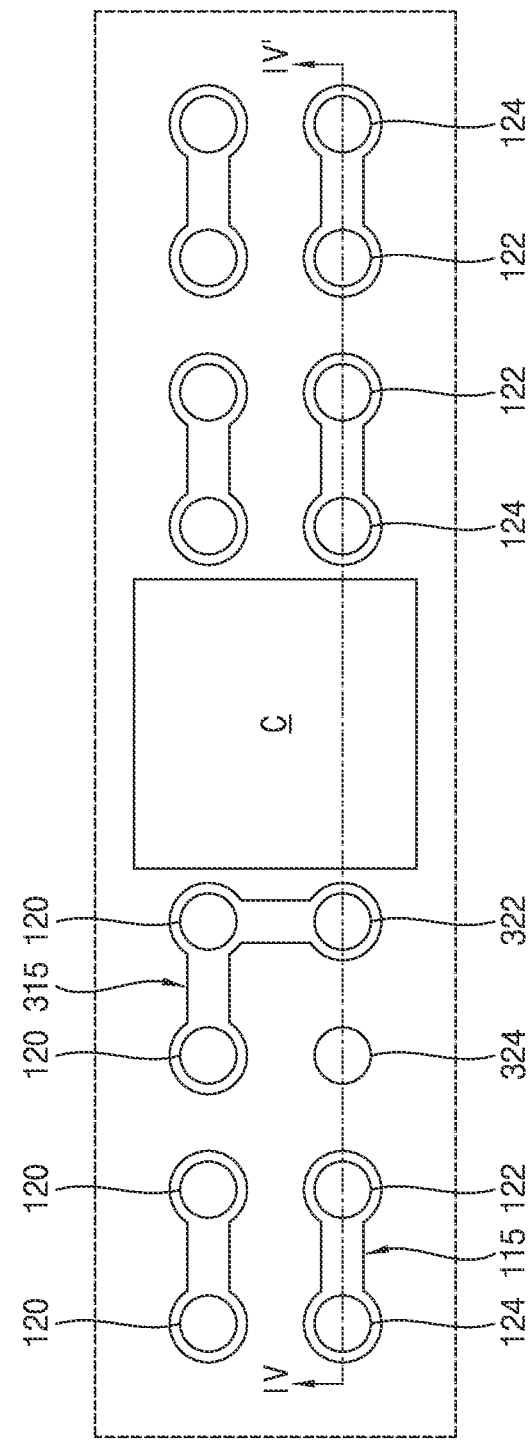
FIG. 18 is a plan view of semiconductor packages according to an example embodiment of the disclosure.

FIG. 16 is a vertical cross-sectional view of a semiconductor package according to an example embodiment of the disclosure. FIGS. 17 and 18 are plan views of semiconductor packages according to example embodiments of the disclosure. FIG. 16 may correspond to a vertical cross-sectional view taken along line III-III' in FIG. 17 or may correspond to a vertical cross-sectional view taken along line IV-IV' in FIG. 18.

Referring to FIG. 16, a semiconductor package 300 may include a wiring pattern 315, a connection pillar 322, and a dummy pillar 324 which are disposed on a lower redistribution structure 140. In an embodiment, the connection pillar 322 may be disposed on the wiring pattern 315, but the dummy pillar 324 may not be disposed on the wiring pattern 315. For example, the dummy pillar 324 may contact a top surface of the lower redistribution structure 140, and a bottom surface of the dummy pillar 324 may be disposed at a lower level than a bottom surface of the connection pillar 322. In addition, a top surface of the dummy pillar 324 may be disposed at a lower level than top surfaces of a metal pattern 120 and the connection pillar 322. In an embodiment, the height (the vertical length) of the dummy pillar 324 may be equal to the height of the connection pillar 322.

Referring to FIG. 17, in an embodiment, a wiring pattern 315 and a connection pillar 322 may overlap each other in a vertical direction, and may be concentrically disposed. In addition, the wiring pattern 315 may not be connected to any of the plurality of the metal pattern 120.

Referring to FIG. 18, in an embodiment, a wiring pattern 315 may be connected to a connection pillar 322 and a plurality of the metal pattern 120. For example, in a plan view, the wiring pattern 315 may have a curved shape or a bent line shape. The plurality of the metal pattern 120 connected to the wiring pattern 315 may be a plurality of the dummy pillar 124, and may not contact a connection via 168.

Figure 19:
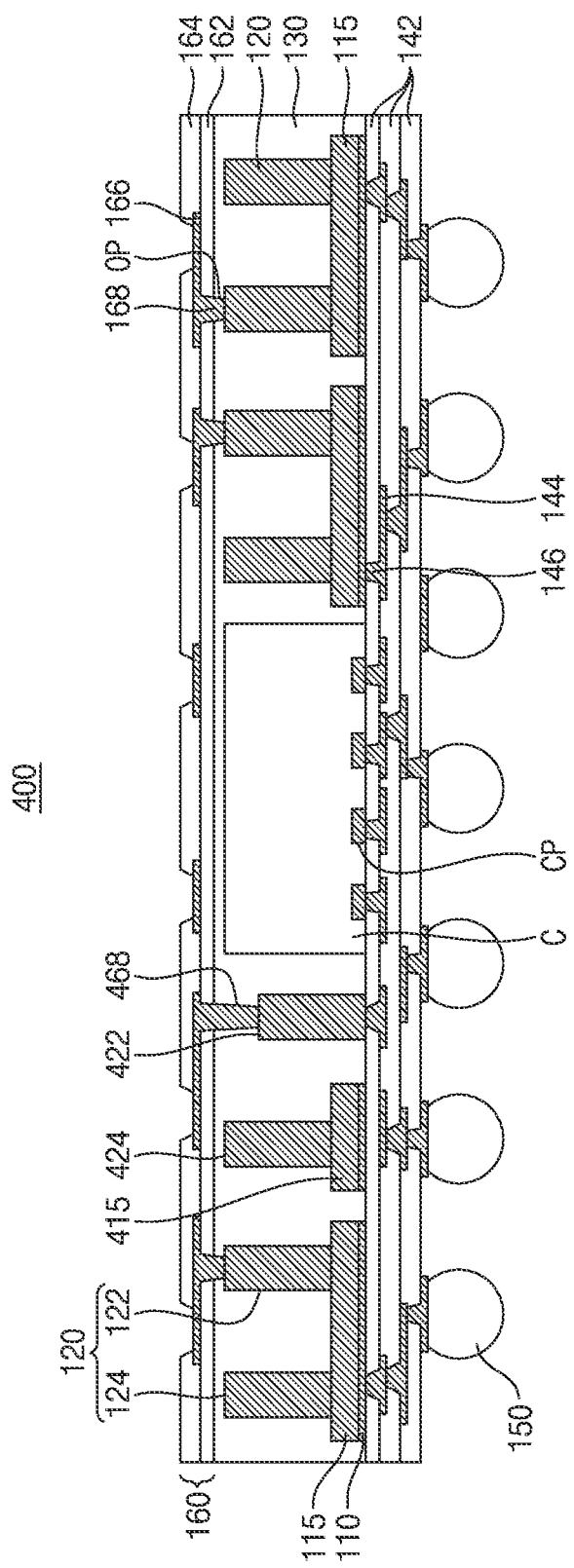
FIG. 19 is a vertical cross-sectional view of a semiconductor package according to an example embodiment of the disclosure.
Figure 20:
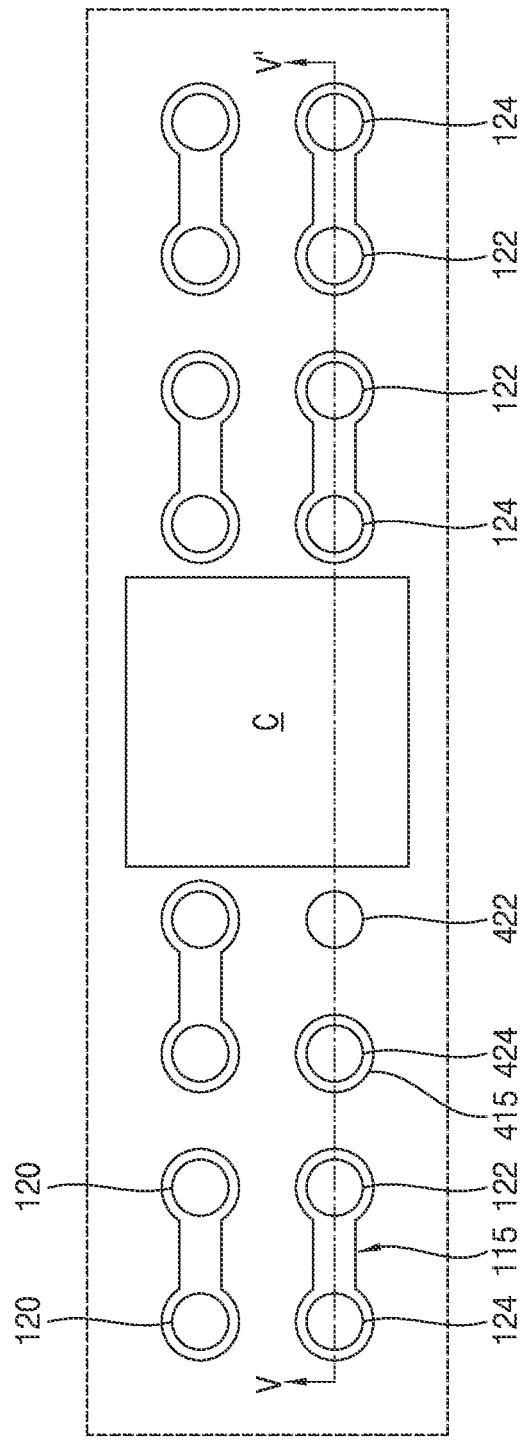
FIG. 20 is a plan view of semiconductor packages according to example embodiment of the disclosure.
Figure 21:
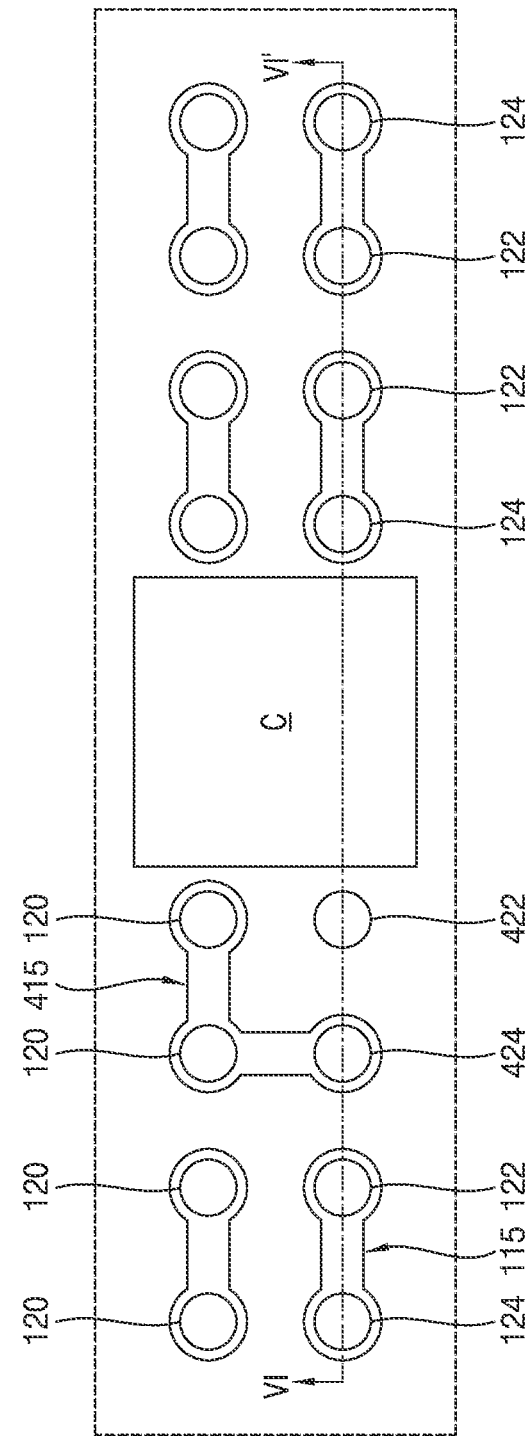
FIG. 21 is a plan view of semiconductor packages according to an example embodiment of the disclosure.

FIG. 19 is a vertical cross-sectional view of a semiconductor package according to an example embodiment of the disclosure. FIGS. 20 and 21 are plan views of semiconductor packages according to example embodiments of the disclosure. FIG. 19 may correspond to a vertical cross-sectional view taken along line V-V' in FIG. 20 or may correspond to a vertical cross-sectional view taken along line VI-VI' in FIG. 21.

Referring to FIG. 19, a semiconductor package 400 may include a wiring pattern 415, a connection pillar 422, and a dummy pillar 424 which are disposed on a lower redistribution structure 140. In an embodiment, the dummy pillar 424 may be disposed on the wiring pattern 415, but the connection pillar 422 may not be disposed on the wiring pattern 415. For example, the connection pillar 422 may contact a top surface of the lower redistribution structure 140, and a bottom surface of the connection pillar 422 may be disposed at a lower level than a bottom surface of the dummy pillar 424. In addition, a top surface of the connection pillar 422 may be disposed at a lower level than top surfaces of a metal pattern 120 and the connection pillar 422. In an embodiment, the height of the connection pillar 422 may be equal to the height of the dummy pillar 424.

An upper redistribution structure 160 of the semiconductor package 400 may further include a connection via 468 contacting the connection pillar 122. Since the top surface of the connection pillar 422 is disposed at a lower level than a top surface of the connection pillar 122, the connection via 468 may be formed such that the height (the vertical length) of the connection via 468 is greater than the height (the vertical length) of a connection via 168. For example, top surfaces of the connection via 468 and the connection via 168 may be disposed at the same level, but a bottom surface of the connection via 468 may be disposed at a lower level than a bottom surface of the connection via 168. In addition, one of the vias 146 that is contacting the bottom surface of the connection pillar 422 may overlap with the connection pillar 422 in a vertical direction.

Referring to FIG. 20, in an embodiment, a wiring pattern 415 and a dummy pillar 424 may overlap each other in a vertical direction, and may be concentrically disposed. In addition, the wiring pattern 415 may not be connected to any of the plurality of the metal pattern 120.

Referring to FIG. 21, in an embodiment, a wiring pattern 415 may be connected to a dummy pillar 424 and a plurality of the metal pattern 120. For example, in a plan view, the wiring pattern 415 may have a curved shape or a bent line shape. At least one of the plurality of the metal pattern 120 connected to the wiring pattern 415 may be a connection pillar 122.

Figure 22:
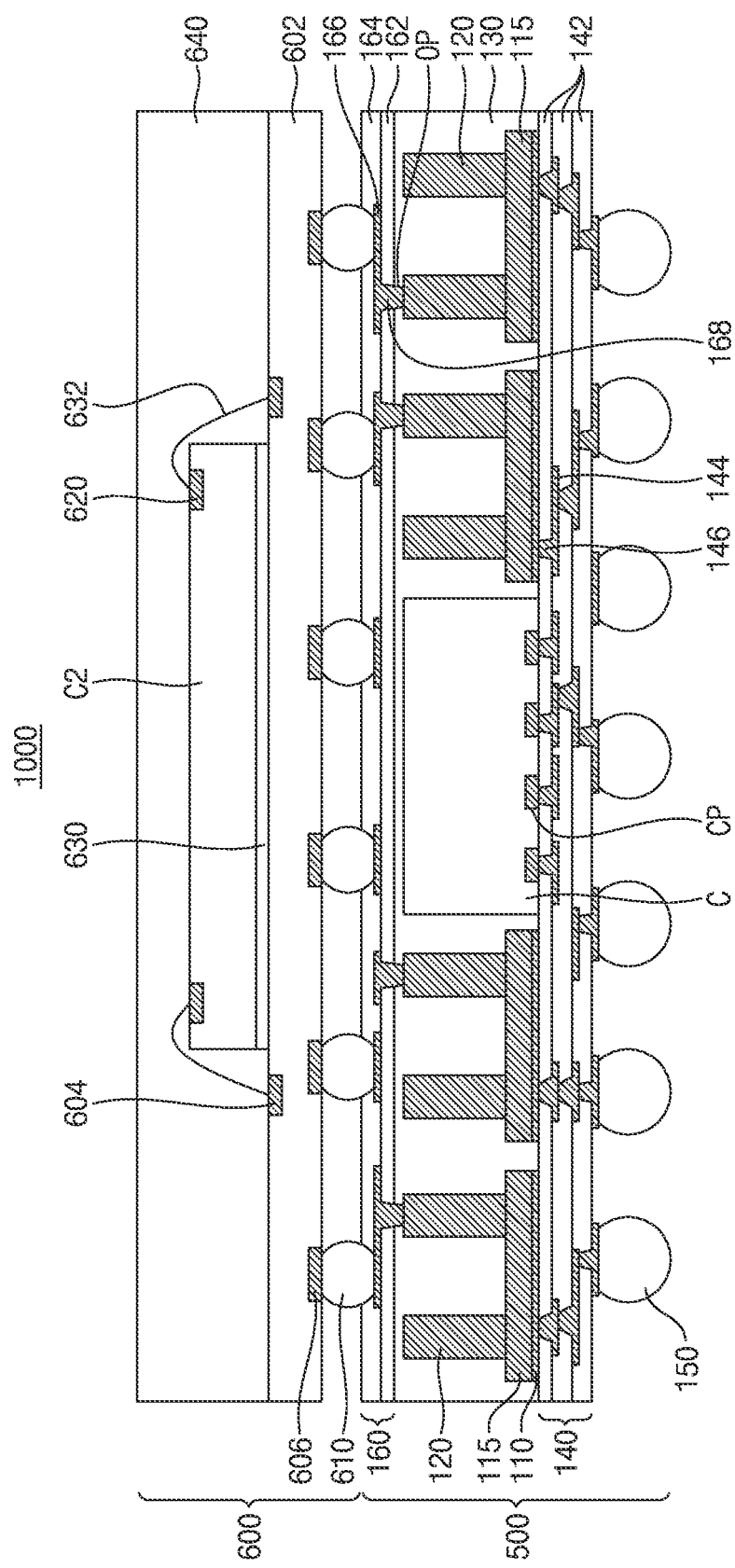
FIG. 22 is a vertical cross-sectional view of semiconductor packages according to an example embodiment of the disclosure.
Figure 23:
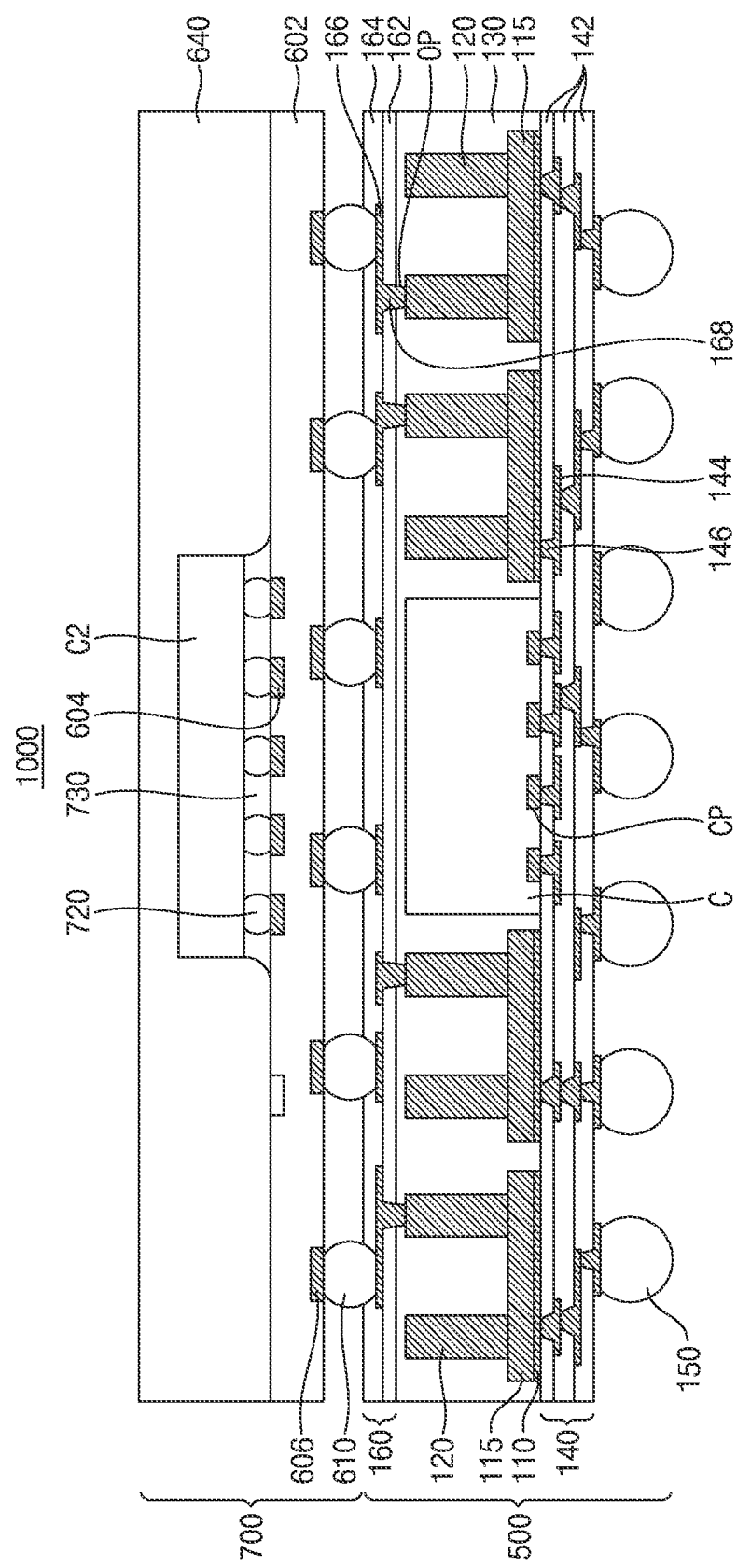
FIG. 23 is a vertical cross-sectional view of semiconductor packages according to an example embodiment of the disclosure.

FIGS. 22 and 23 are vertical cross-sectional views of semiconductor packages according to example embodiments of the disclosure.

Referring to FIG. 22, a semiconductor package 1000 may have a package-on-package structure. For example, the semiconductor package 1000 may include a lower package 500, and an upper package 600 on the lower package 500. The lower package 500 may have a structure identical or similar to that of the semiconductor package 100 described with reference to FIGS. 1 to 3. According to embodiments, the lower package 500 may have a structure identical or similar to that of the semiconductor package 200 described with reference to FIGS. 14 and 15, the semiconductor package 300 described with reference to FIGS. 16 to 18, or the semiconductor package 400 described with reference to FIGS. 19 to 21. The lower package 500 may have characteristics of the semiconductor package 100 (or the semiconductor package 200, or the semiconductor package 300, or the semiconductor package 400) and, as such, detailed description thereof will not be repeated.

The upper package 600 may include a substrate 602, a package connection terminal 610, a semiconductor chip C2, an adhesive member 630, bonding wires 632, and an encapsulant 640. The substrate 602 may include upper pads 604 and lower pads 606. In an embodiment, the substrate 602 may be a printed circuit board, and may include an insulating material such as a phenolic resin, an epoxy resin, a prepreg, etc. In another embodiment, the substrate 602 may be a redistribution layer in which an insulating material and a conductive material are stacked. The upper pads 604 and the lower pads 606 may be formed by forming a metal layer at a base of the substrate 602, and then patterning the metal layer. Although not shown, a solder resist layer may be disposed at top and bottom surfaces of the substrate 602, and may partially cover the upper pads 604 and the lower pads 606.

The upper pads 604 may be disposed at the top surface of the substrate 602, and may be electrically connected to the semiconductor chip C2. The lower pads 606 may be disposed at the bottom surface of the substrate 602, and at least one of the lower pads 606 may be electrically connected to a corresponding one of the upper pads 604. The package connection terminal 610 may be connected to one of the lower pads 606 and a wiring layer 166 of an upper redistribution structure 160. The package connection terminal 610 may electrically interconnect the upper package 600 and the lower package 500.

The lower pads 606 and the upper pads 604 may include a metal such as aluminum (Al), titanium (Ti), chrome (Cr), iron (Fe), cobalt (Co), nickel (Ni), copper (Cu), zinc (Zn), lead (Pd), platinum (Pt), gold (Au), and silver (Ag). The package connection terminal 610 may be a solder bump.

The semiconductor chip C2 may be mounted on the substrate 602. A semiconductor chip C of the lower package 500 and the semiconductor chip C2 of the upper package 600 may be semiconductor devices of different kinds, respectively. For example, the semiconductor chip C may include an application processor chip such as a microprocessor, a microcontroller, etc. or a logic chip such as a CPU, a GPU, a modem, an application-specific integrated chip (ASIC), a field programmable gate array (FPGA), etc. The semiconductor chip C2 may include a volatile memory chip such as dynamic random-access memory (DRAM) or a non-volatile memory chip such as flash memory. The semiconductor chip C2 may be mounted on the substrate 602 via wire bonding. For example, the semiconductor chip C2 may include chip pads 620 at a top surface thereof, and the chip pads 620 may be electrically connected to the upper pads 604 by bonding wires 632. The semiconductor chip C2 may be electrically connected to a lower redistribution structure 140. For example, the semiconductor chip C2 may be electrically connected to the lower redistribution structure 140 via a wiring pattern 115, a metal pattern 120, the upper redistribution structure 160, the package connection terminal 610, and the substrate 602.

The adhesive member 630 may be disposed between the substrate 602 and the semiconductor chip C2, and may fix the semiconductor chip C2 to the top surface of the substrate 602. The adhesive member 630 may be a die attach film, without being limited thereto. The encapsulant 640 may cover the substrate 602, the semiconductor chip C2, and the bonding wires 632. The encapsulant 640 may include an epoxy resin.

Referring to FIG. 23, the semiconductor package 1000 may include a lower package 500, and an upper package 700 on the lower package 500. The upper package 700 may include a semiconductor chip C2, bumps 720, and an underfill 730. In an embodiment, the semiconductor chip C2 may be mounted on a substrate 602 via flip chip bonding. Bumps 720 may be disposed at a bottom surface of the semiconductor chip C2, and may contact upper pads 604. The underfill 730 may be disposed between the substrate 602 and the semiconductor chip C2, and may cover the bumps 720. The underfill 730 may include a non-conductive paste (NCP), a non-conductive film (NCF), a capillary underfill (CUF), or other insulating materials.

In accordance with example embodiments of the disclosure, a wiring pattern may be disposed on a redistribution structure and, as such, freedom of design may be secured. Accordingly, a semiconductor device having a reduced size may be realized.

While non-limiting example embodiments of the disclosure have been described with reference to the accompanying drawings, it should be understood by those skilled in the art that various modifications may be made without departing from the scope of the disclosure. Therefore, the above-described embodiments should be considered in a descriptive sense only and not for purposes of limitation.

What is claimed is:

1. A semiconductor package comprising:
   a lower redistribution structure comprising a wiring layer, and a via connected to the wiring layer;
   a semiconductor chip on the lower redistribution structure;
   wiring patterns on the lower redistribution structure, the wiring patterns comprising a first wiring pattern;
   metal patterns on the wiring patterns, the metal patterns comprising a first connection pillar and a first dummy pillar on the first wiring pattern;
   an encapsulant on the lower redistribution structure, the semiconductor chip, the wiring patterns, and the metal patterns; and
   an upper redistribution structure on the encapsulant,
   wherein the first connection pillar is directly connected to the upper redistribution structure, and
   wherein the first wiring pattern comprises pad portions, and a line portion interconnecting the pad portions.

2. The semiconductor package according to claim 1, wherein the first dummy pillar is spaced apart from the upper redistribution structure.

3. The semiconductor package according to claim 2, wherein
   the upper redistribution structure comprises a first connection via contacting the first connection pillar; and
   the via of the lower redistribution structure contacts the first wiring pattern and is spaced apart from the first connection via in a horizontal direction in a plan view.

4. The semiconductor package according to claim 1, wherein the via of the lower redistribution structure contacts the first wiring pattern and is spaced apart from the first connection pillar in a horizontal direction in a plan view.

5. The semiconductor package according to claim 1, wherein the metal patterns are disposed to form a lattice structure having a uniform spacing.

6. The semiconductor package according to claim 1, wherein the first connection pillar and the first dummy pillar overlap with the pad portions, respectively, in a vertical direction.

7. The semiconductor package according to claim 1, wherein a maximum width of each of the pad portions is greater than a maximum width of each of the metal patterns.

8. The semiconductor package according to claim 7, wherein the maximum width of each of the pad portions is 130 to 230 µm, and the maximum width of each of the metal patterns is 60 to 160 µm.

9. The semiconductor package according to claim 1, wherein a height of the metal patterns is greater than a height of the wiring patterns.

10. The semiconductor package according to claim 9, wherein a vertical length of each of the metal patterns is 65 to 100 µm, and a vertical length of each of the wiring patterns is 25 to 45 µm.

11. The semiconductor package according to claim 1, wherein
    the wiring patterns further comprise a second wiring pattern;
    the metal patterns further comprise a pillar on the second wiring pattern; and
    the pillar on the second wiring pattern is one in number.

12. The semiconductor package according to claim 1, wherein at least one of the wiring patterns is a dummy pattern spaced apart from the metal patterns.

13. The semiconductor package according to claim 1, wherein:
    the wiring patterns further comprise a second wiring pattern;
    the metal patterns further comprise a second connection pillar on the second wiring pattern, and a second dummy pillar spaced apart from the second wiring pattern; and
    a bottom surface of the second dummy pillar is at a level lower than a level of a bottom surface of the second connection pillar.

14. The semiconductor package according to claim 1, wherein
    the wiring patterns further comprise a second wiring pattern;

the metal patterns further comprise a second dummy pillar on the second wiring pattern, and a second connection pillar spaced apart from the second wiring pattern; and a bottom surface of the second connection pillar is at a level lower than a level of a bottom surface of the second dummy pillar.

15. The semiconductor package according to claim 14, wherein the upper redistribution structure comprises a first connection via contacting the first connection pillar, and a second connection via contacting the second connection pillar, and a vertical length of the second connection via is greater than a vertical length of the first connection via.

16. A semiconductor package comprising:
a lower package; and
an upper package on the lower package,
wherein the lower package comprises:
   a lower redistribution structure comprising a wiring layer, and a via connected to the wiring layer,
   a first semiconductor chip on the lower redistribution structure;
   wiring patterns on the lower redistribution structure, the wiring patterns comprising a first wiring pattern;
   metal patterns on the wiring patterns, the metal patterns comprising connection pillars and dummy pillars on the wiring patterns;
   a first encapsulant covering the lower redistribution structure, the first semiconductor chip, the wiring patterns, and the metal patterns; and
   an upper redistribution structure on the first encapsulant,
wherein the upper package comprises:
   a substrate;
   a second semiconductor chip on the substrate;
   at least one package connection terminal, under the substrate, electrically connected to the upper redistribution structure; and
   a second encapsulant on the substrate and the second semiconductor chip,
wherein the first wiring pattern comprises pad portions, and a line portion interconnecting the pad portions.

17. The semiconductor package according to claim 16, wherein the second semiconductor chip is electrically connected to the lower redistribution structure via the substrate, the at least one package connection terminal, the upper redistribution structure, the connection pillars, and the wiring patterns.

18. A semiconductor package comprising:
a lower redistribution structure comprising a wiring layer, and a via connected to the wiring layer;
an outer connection terminal under the lower redistribution structure;
a semiconductor chip on the lower redistribution structure;
wiring patterns on the lower redistribution structure;
metal patterns on the wiring patterns, the metal patterns comprising connection pillars and dummy pillars;
an encapsulant covering the lower redistribution structure, the semiconductor chip, the wiring patterns, and the metal patterns; and
an upper redistribution structure on the encapsulant, the upper redistribution structure comprising connection vias contacting the connection pillars,
wherein the metal patterns form a lattice structure having a uniform spacing, and
wherein at least one of the connection pillars and at least one of the dummy pillars are on each of the wiring patterns.

19. The semiconductor package according to claim 18, wherein:
each of the wiring patterns comprises pad portions, and a line portion interconnecting the pad portions; and
the connection pillars and the dummy pillars overlap with the pad portions, respectively, in a vertical direction.

* * * * *